United States Patent
Cho

(10) Patent No.: US 8,017,414 B2
(45) Date of Patent: Sep. 13, 2011

(54) METHOD FOR MANUFACTURING LIGHT EMITTING DEVICE USING NON-POLAR SUBSTRATE

(75) Inventor: Sung Ryong Cho, Seoul (KR)

(73) Assignee: LG Innotek Co., Ltd., Seoul (KR)

(*) Notice: Subject to any disclaimer, the term of this patent is extended or adjusted under 35 U.S.C. 154(b) by 184 days.

(21) Appl. No.: 12/514,751

(22) PCT Filed: Jan. 21, 2009

(86) PCT No.: PCT/KR2009/000319
§ 371 (c)(1),
(2), (4) Date: May 13, 2009

(87) PCT Pub. No.: WO2009/093846
PCT Pub. Date: Jul. 30, 2009

(65) Prior Publication Data
US 2010/0317131 A1  Dec. 16, 2010

(30) Foreign Application Priority Data
Jan. 21, 2008 (KR) .................. 10-2008-0006071

(51) Int. Cl.
*H01L 33/12* (2010.01)
(52) U.S. Cl. ...... 438/22; 438/28; 257/103; 257/E33.001
(58) Field of Classification Search .............. 438/22–28; 257/E33.001, 81–117, 432–437, 749, E33.056–E33.059, 257/E25.032
See application file for complete search history.

(56) References Cited

U.S. PATENT DOCUMENTS

| | | | |
|---|---|---|---|
| 5,814,533 A * | 9/1998 | Shakuda | 438/46 |
| 2003/0134446 A1* | 7/2003 | Koike et al. | 438/41 |
| 2003/0198837 A1* | 10/2003 | Craven et al. | 428/698 |
| 2004/0209402 A1* | 10/2004 | Chai et al. | 438/122 |
| 2006/0270076 A1* | 11/2006 | Imer et al. | 438/22 |
| 2007/0205429 A1* | 9/2007 | Kim | 257/103 |
| 2007/0254459 A1* | 11/2007 | Lee et al. | 438/483 |
| 2010/0308368 A1* | 12/2010 | Lee et al. | 257/99 |

FOREIGN PATENT DOCUMENTS

| | | | |
|---|---|---|---|
| KR | 8-64912 A | | 3/1996 |
| KR | 10-2002-0084194 A | | 11/2002 |
| KR | 10-0648813 B1 | | 11/2006 |
| KR | 648813 | * | 11/2006 |
| KR | 10-0663016 B1 | | 12/2006 |
| KR | 663016 | * | 12/2006 |

* cited by examiner

*Primary Examiner* — Hsien-ming Lee
*Assistant Examiner* — Walter H Swanson
(74) *Attorney, Agent, or Firm* — Birch, Stewart, Kolasch & Birch, LLP

(57) ABSTRACT

A method for manufacturing a light emitting device includes preparing a substrate where a crystal growth surface has an a-plane or an m-plane; forming a buffer layer on the substrate; forming a semiconductor layer on the buffer layer; and separating the semiconductor layer from the substrate by removing the buffer layer.

13 Claims, 8 Drawing Sheets

【Figure 1】
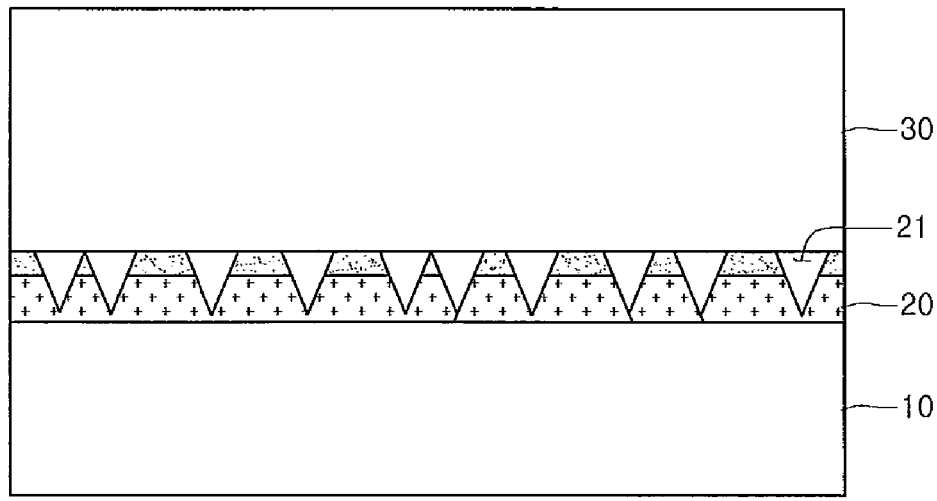
【Figure 2】
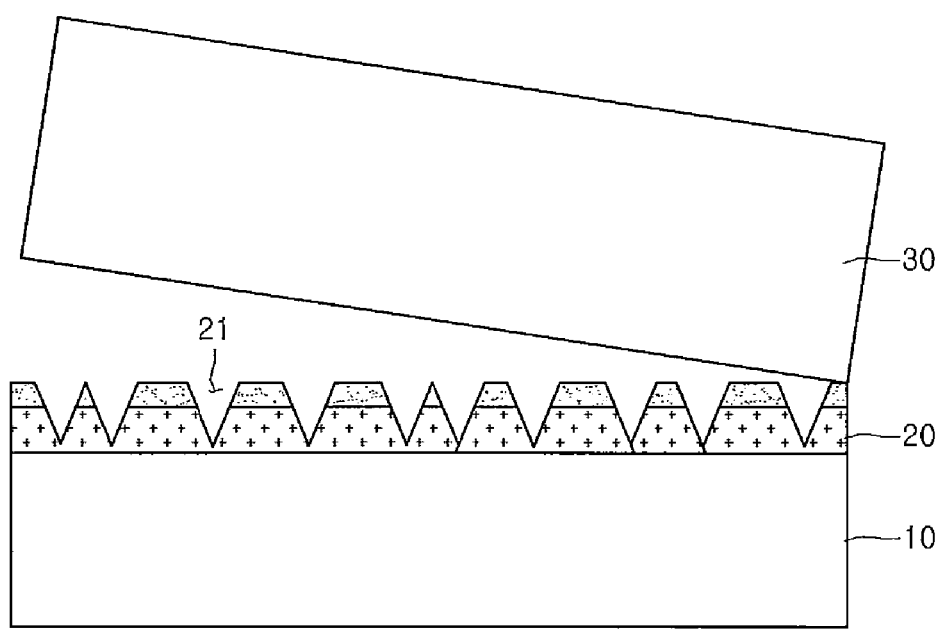

【Figure 3】
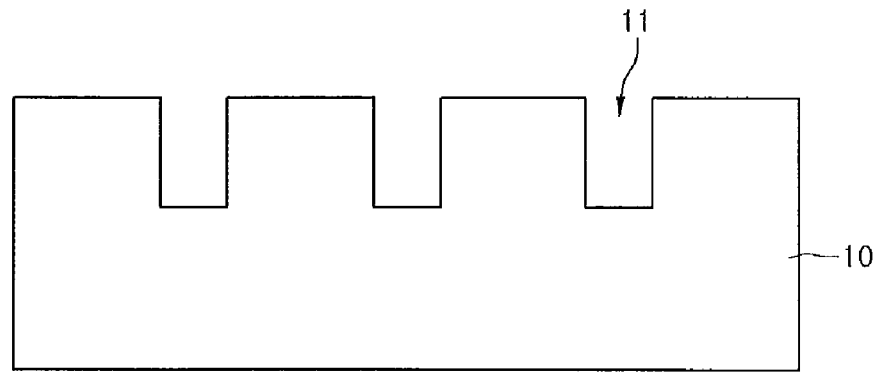
【Figure 4】
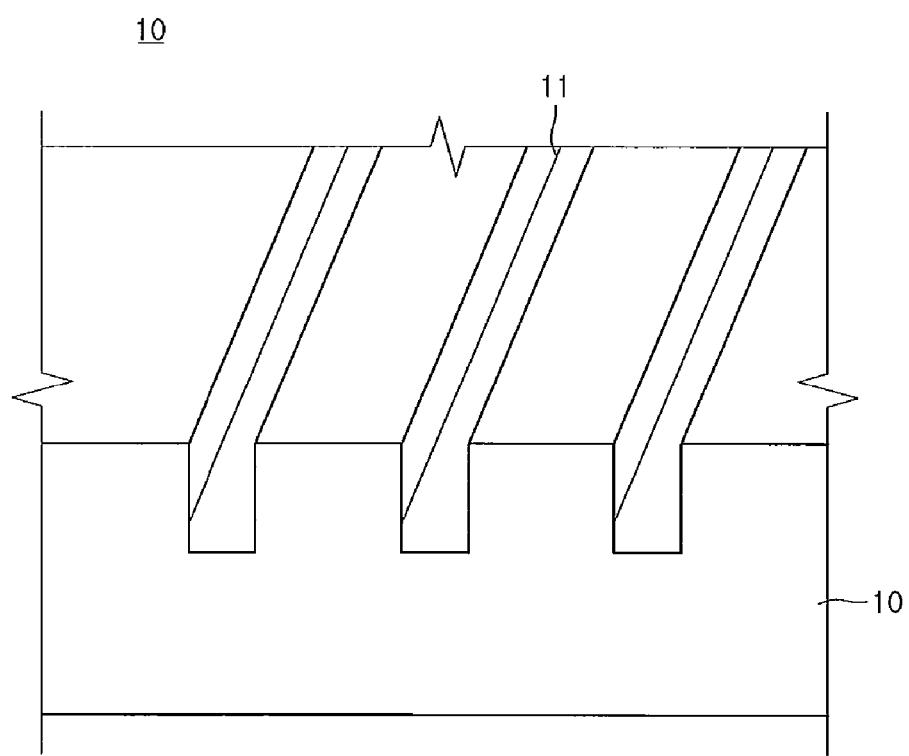

[Figure 5]
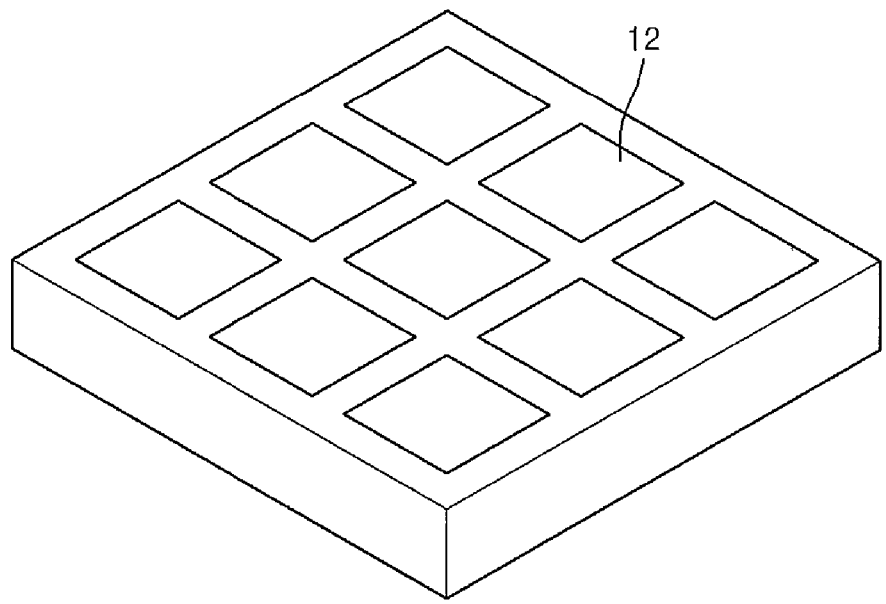
[Figure 6]
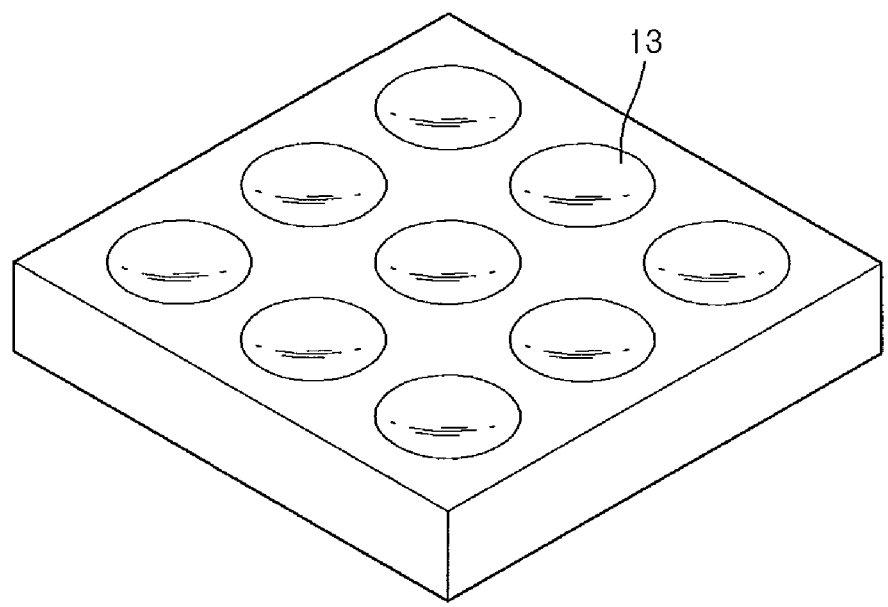

[Figure 7]
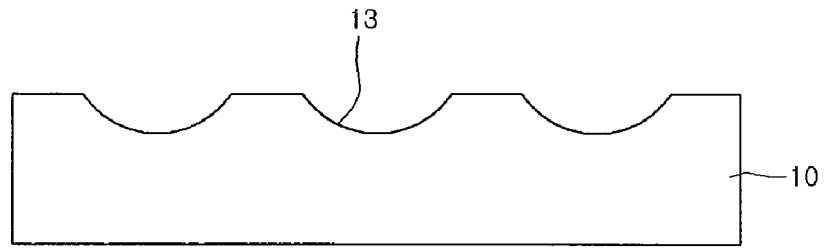
[Figure 8]
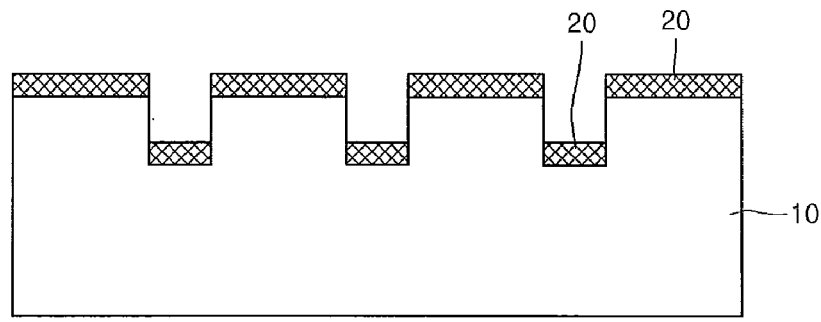
[Figure 9]
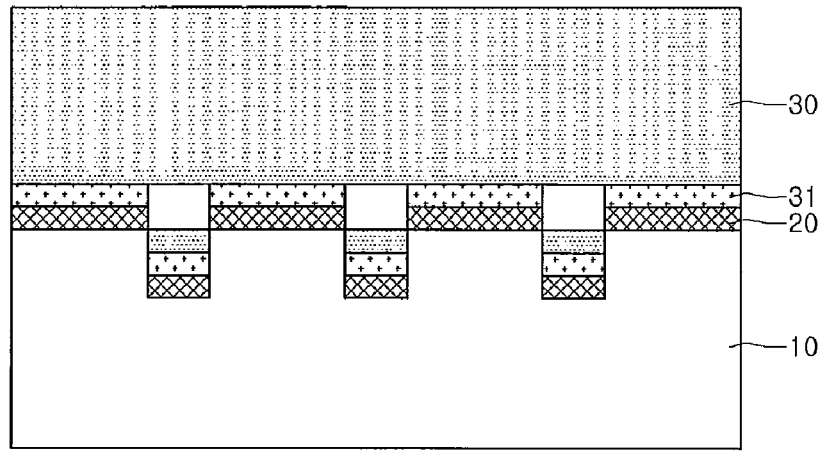

[Figure 10]
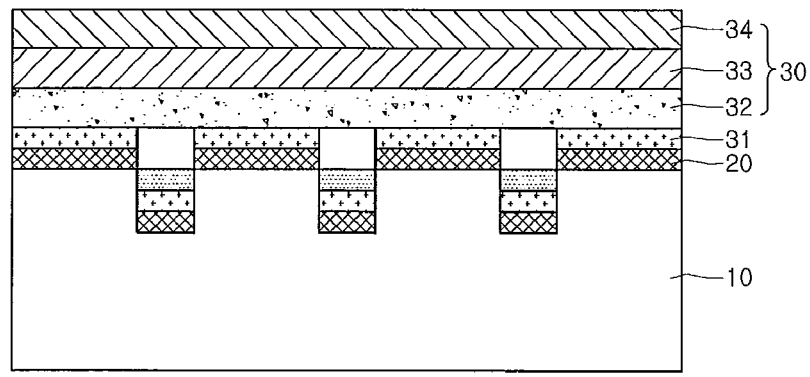
[Figure 11]
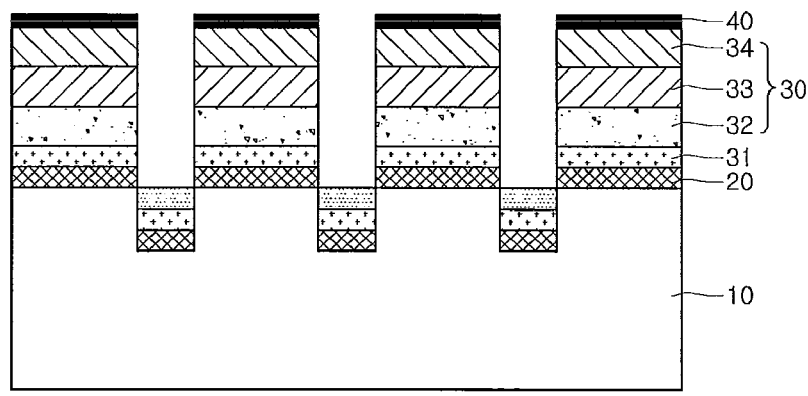
[Figure 12]
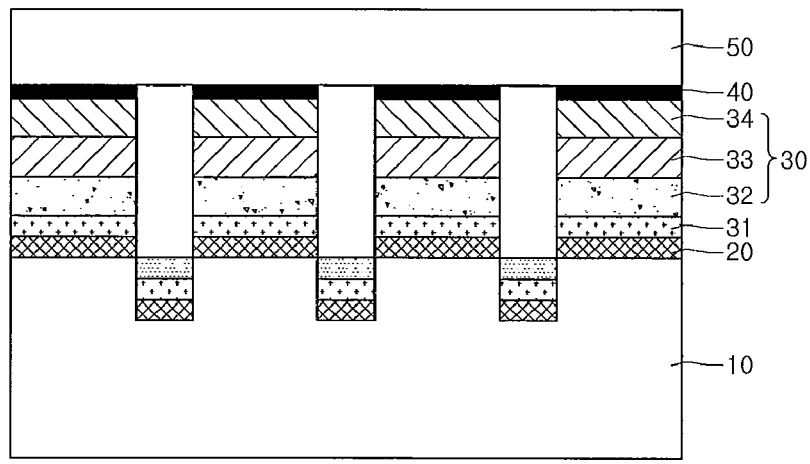

[Figure 13]
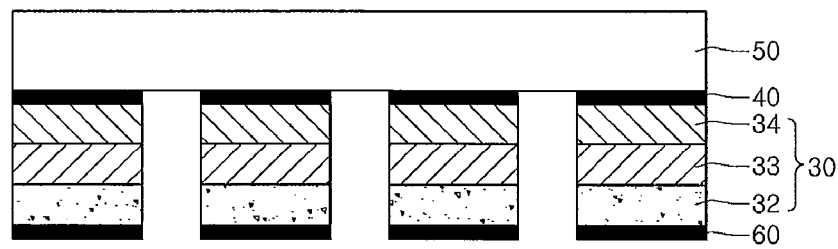
[Figure 14]
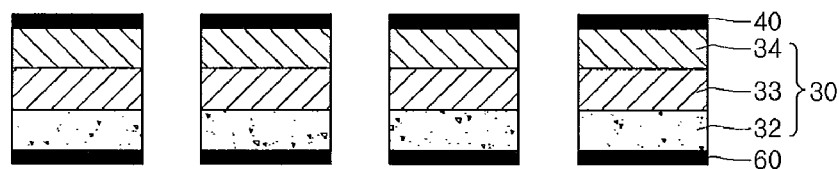
[Figure 15]
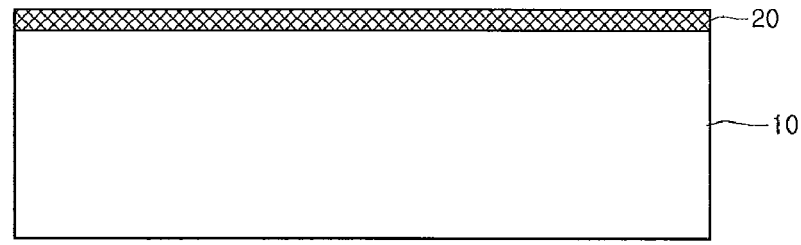
[Figure 16]
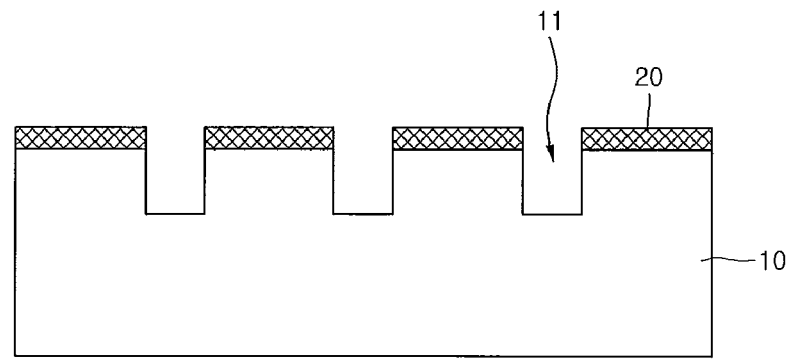

【Figure 17】
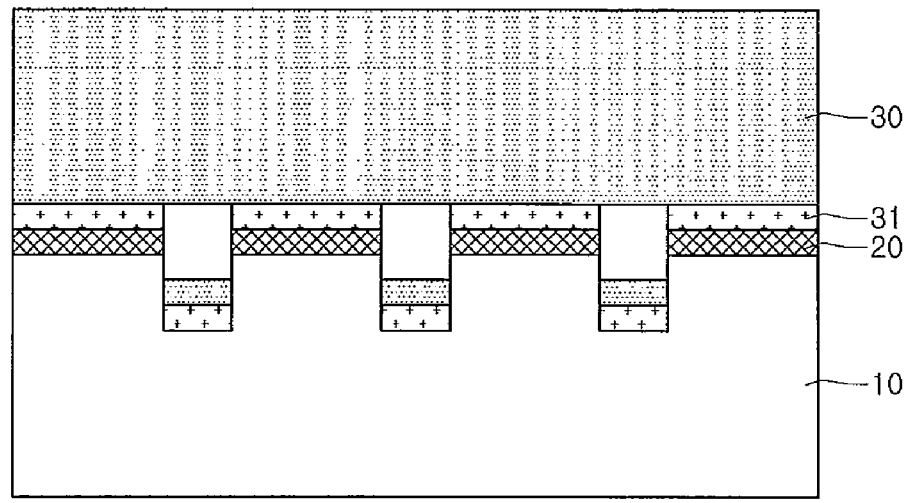
【Figure 18】
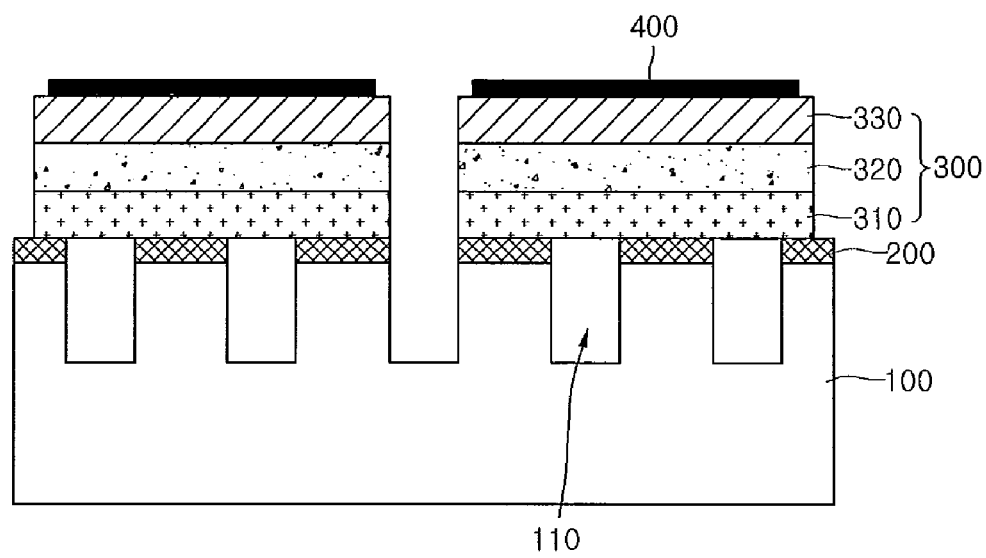

[Figure 19]
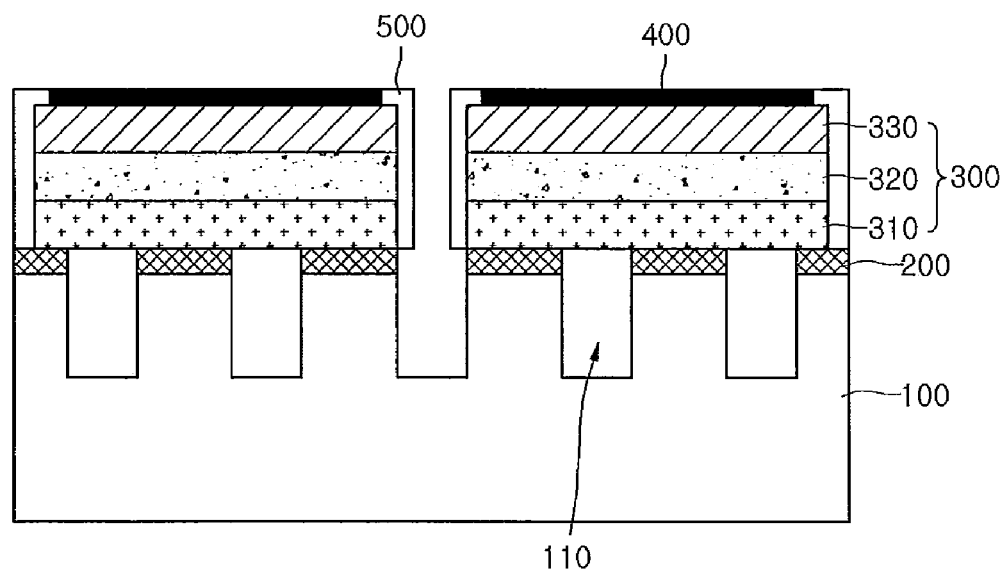
[Figure 20]
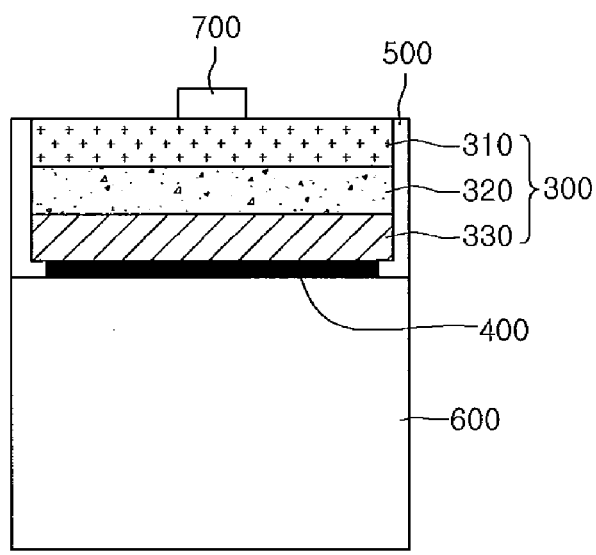

METHOD FOR MANUFACTURING LIGHT EMITTING DEVICE USING NON-POLAR SUBSTRATE

TECHNICAL FIELD

The embodiment relates to a method for manufacturing a light emitting device.

BACKGROUND ART

A Light Emitting Device (LED) is a semiconductor device converting current into light. Beginning with a commercialized red LED, red and green LEDs are used as a light source of an electron device including an information communication device.

For example, a Gallium Nitride (GaN) semiconductor has a high thermal stability and wide bandgap, and also is combined with other elements such as In, Al, etc. to manufacture a semiconductor layer for emitting green, blue, and white color lights. Additionally, because emission wavelength is easily controlled, the GaN semiconductor attracts considerable attention from high-output electron device development fields including an LED.

However, the reason that the GaN semiconductor growth has more difficulties than other group III-V compound semiconductors is that there is no high-quality substrate, for example, a wafer including materials such as GaN, InN, and AlN.

Accordingly, when an LED structure grows on a heterogeneous substrate like sapphire, defects occur frequently and thus affect the LED performance.

DISCLOSURE

Technical Problem

Embodiments provide a method for manufacturing a light emitting device where a high-quality nitride semiconductor can be formed.

Technical Solution

In one embodiment, a method for manufacturing a light emitting device includes: preparing a substrate where a crystal growth surface has an a-plane or an m-plane; forming a buffer layer on the substrate; forming a semiconductor layer on the buffer layer; and separating the semiconductor layer from the substrate by removing the buffer layer.

In another embodiment, a method for manufacturing a light emitting device includes: preparing a substrate; forming a pattern on the substrate; forming a semiconductor layer on the substrate having the pattern; and separating the semiconductor layer from the substrate by using the pattern as a basis.

In further another embodiment, a method for manufacturing a light emitting device includes: preparing a substrate; forming a first buffer layer on the substrate; forming a pattern on the substrate having the first buffer layer; forming a semiconductor layer on the substrate having the pattern; and separating the semiconductor layer from the substrate by using the pattern as a basis.

Advantageous Effects

According to a method for manufacturing a light emitting device, a semiconductor layer is formed to have non-polarity on a non-polar substrate through a lateral growth method of a semiconductor, and thus a high-quality nitride semiconductor can be formed.

Additionally, according to an embodiment, since a substrate is separated stably without impact and stress through etching, it is possible to provide a high-quality nitride semiconductor substrate.

Moreover, according to an embodiment, if a vertical light emitting device is formed through a high-quality nitride semiconductor, light emission efficiency, reliability, and productivity can be improved.

DESCRIPTION OF DRAWINGS

FIGS. 1 and 2 are manufacturing sectional views illustrating a method for manufacturing a light emitting device according to a first embodiment.

FIGS. 3 to 9 are views illustrating a method for manufacturing a light emitting device according to a second embodiment.

FIGS. 10 to 14 are views illustrating a method for manufacturing a light emitting device according to a third embodiment.

FIGS. 15 to 17 are views illustrating a method for manufacturing a light emitting device according to a fourth embodiment.

FIGS. 18 to 20 are views illustrating a method for manufacturing a light emitting device according to a fifth embodiment.

BEST MODE

Embodiments will be described in detail with reference to the accompanying drawings.

In the description of embodiments, it will be understood that when a layer (or film), region, pattern or structure is referred to as being 'on/over' another layer (or film), region, pad or pattern, the terminology of 'on/over' and 'under' includes both the meanings of 'directly' and 'indirectly'. Further, the reference about 'on/over' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

The embodiments will be described referring to a GaN-based light emitting device formed on a non-conductive substrate such as a sapphire ($Al_2O_3$) substrate. However, the present invention is not limited to the above structure.

Additionally, the embodiments can use a conductive substrate or other substrates. Accordingly, the embodiments can include an AlGaInP diode on a GaP substrate, a GaN diode on a SiC substrate, a SiC diode on a SiC substrate, a SiC diode on a sapphire substrate, and/or a combination of a nitride-based diode on a substrate including GaN, SiC, AlN, ZnO, and/or etc. Additionally, an active region of the embodiment is not limited to a use of a diode region. Moreover, other forms of an active region can be used according to the embodiments.

Moreover, dislocation density becomes more than $10^8/cm^2$ in GaN-based devices growing on the sapphire substrate because of lattice mismatch and thermal expansion coefficient mismatch between the sapphire and the GAN. Accordingly, required is a method for reducing the above lattice mismatch.

GaN and its alloys are the most stable in a hexagonal wurtzite crystal structure. This crystal structure has a rotational symmetry of 120° with respect to each other, and is represented through three equal basal plane axes ($a_1$, $a_2$, $a_3$), all of which are perpendicular to a c-axis of a vertical direction.

Group III and nitride elements alternately occupy a c-plane 0001 along the c-axis of the crystal. Symmetry components included in the wurtzite crystal structure represents bulk spontaneous polarization along the c-axis.

Moreover, since this wurtzite crystal structure is noncentrosymmetric, wurtzite nitrides can additionally represent piezoelectric polarization along the c-axis of the crystal.

Typical nitride techniques for electron and photoelectron devices utilize nitride thin layers grown along the c-direction of polarization. However, because of strong piezoelectric and spontaneous polarization, typical c-plane quantum well structures in the Group III and nitride elements are affected by undesirable quantum-confined Stark effect (QCSE).

Accordingly, strong built-in electric fields along the c-direction bend an energy band in order to spatially separate electrons and holes, such that carrier recombination efficiency is limited and oscillator intensity is reduced, and also red shift light emission occurs.

A method for removing the spontaneous and piezoelectric polarization effect from the GaN photoelectron devices is to grow devices on a non-polar plane of the crystal. These planes include the same numbers of Ga and N atoms and are in a charge-neutral state.

Moreover, the continuous non-polar planes are equivalent to each other such that the entire crystal is not polarized in a growth direction. Two families of symmetry-equivalent non-polar planes in the GaN crystal structure are a group of a collective a-plane {11-20} and a group of a collective m-plane {1-100}.

The GaN-based (AlGaInN) quantum well structures adopting an a-direction or an m-direction, which is a non-polar growth direction, can be an effective means for removing polarization-induced electric fields in the wurtzite nitride structures.

The reason is that the polarization axis is disposed in a growing plane of a film and accordingly, is parallel to heterointerfaces of quantum wells.

The a-plane or m-plane GaN series semiconductor thin layer having non-polarity can be effectively grown on a non-polar substrate having the a-plane or the m-plane.

Accordingly, the non-polar GaN-based semiconductor device can be effectively manufactured by growing a GaN-based semiconductor thin layer on a substrate of sapphire, SiC, etc. having non-polarity.

Besides, the nitride-based light emitting device structure is formed by growing the GaN semiconductor layer on a substrate including SiC and Si. However, because of a lattice constant difference and a thermal expansion coefficient difference between the substrate and the grown GaN semiconductor, defective density is high. That is, the defective density of more than $10^8/cm^2$ is included in a thin layer of a device. This deteriorates electrical characteristics because of light emission efficiency deterioration, low electrostatic characteristic, and high leakage current.

Additionally, when a sapphire substrate, i.e., an electrical insulation substrate, is used, it is impossible to form an electrode below the substrate. Therefore, a complex process for etching a semiconductor thin layer is required to form an electrode.

Recently, a GaN substrate is manufactured through a hydride vapor phase epitaxy (HVPE) method and there is a case where the GaN substrate is applied to a light emitting device. However, since the GaN substrate is too expensive, it is hard to put the GaN substrate to practical use.

Moreover, a laser lift-off method where a sapphire substrate is removed in order to manufacture a vertical light emitting device requires complex processes and expensive equipment and also causes damage in a peripheral semiconductor layer during the removing process of the substrate. Therefore, more simple and low cost manufacturing process developments are required.

First Embodiment

FIGS. 1 and 2 are manufacturing sectional views illustrating a method for manufacturing a light emitting device according to a first embodiment.

As shown in FIG. 1, a buffer 20 can be formed on a substrate 10 including sapphire, SiC, etc., and a semiconductor layer 30 can be formed on the buffer layer 20. The semiconductor layer 30 can be a GaN semiconductor layer.

The substrate 10 can use a non-polar substrate including an a-plane {11-20} or an m-plane {1-100} since the a-plane or m-plane non-polar GaN semiconductor layer 30 can be effectively grown on the non-polar substrate.

Additionally, the buffer layer 20 can be a metallic buffer layer. For example, the buffer layer 20 can include a metal, an alloy of a metal, and a metallic material such as a metal oxide or a metal nitride. This metallic buffer layer 20 can allow the substrate 10 to be separated through a chemical etching method or a spontaneous separation method during a later process for the removing of the substrate 10 to manufacture a vertical light emitting structure.

A regular or irregular groove 21 can be formed in the buffer layer 20. Then, the semiconductor layer 30 can be formed on the groove 21 and can be combined together through a lateral growth to form a layer. During this process, crystal defects such as threading dislocation can be reduced.

For example, the buffer layer 20 can be formed of TiN. As mentioned above, the buffer layer 20 can serve as a mask layer, thereby can help the lateral growth of a semiconductor layer.

Next, as illustrated in FIG. 2, the semiconductor layer 30 grown on the buffer layer 20 can be separated from the substrate 10 through the chemical etching method or a spontaneous separation method.

At this point, the groove 21 in the buffer layer 20 can allow an etching solution to evenly flow on the interface during an etching process, thereby can facilitate the etching process. Moreover, since the separation process of the substrate 10 through the chemical etching greatly can reduce stress on the semiconductor layer 30 and the interface comparing to a lift-off process, damage of the semiconductor layer 30 can be prevented.

Second Embodiment

FIGS. 3 to 9 are views illustrating a method for manufacturing a light emitting device according to a second embodiment. The second embodiment can adopt technical features of the first embodiment, and distinguished contents from the first embodiment will be discussed.

As shown in FIG. 3, a pattern 11 can be formed in a substrate 10 including Si or SiC. The pattern 11 can improve the quality of a semiconductor layer through the lateral growth of the semiconductor layer 30 grown on the substrate 10, and also can allow an etching solution to evenly flow when the substrate 10 is separated through etching.

This pattern 11 can include a pattern 11 having a stripe groove as illustrated in FIG. 4, or a pattern 12 having a rectangular groove as illustrated in FIG. 5.

Additionally, as illustrated in FIG. 6, the pattern can include a circular pattern 13. At this point, as illustrated in FIG. 7, the circular pattern 13 can include a lens form whose section is a circle. On the other hand, the section of the pattern 12 having a rectangular groove and the section of the circular pattern 13 can be a rectangular form and a well-shaped form, respectively.

Next, as illustrated in FIG. 8, a first buffer layer 20 can be formed on the substrate 10 having a certain pattern. The first buffer layer 20 can be a metallic buffer layer. The first buffer layer 20 can be formed of a metal such as Ti, Cr, W, Ni, Mo, Ta, or Zr, a metal nitride such as TiN, CrN, WN, NiN, MoN, TaN, or ZrN, a metal carbide such as TiC, CrC, WC, NiC, MoC, TaC, or ZrC, or a metal oxide such as TiO, CrO, WO, NiO, MoO, TaO, or ZrO.

The first buffer layer 20 can have a thickness of 50 Å to 5,000 Å, and can be deposited on the substrate through sputter or electron beam evaporation.

Next, as illustrated in FIG. 9, a GaN semiconductor layer 30 can be grown on the substrate 10 having the first buffer layer 20. The GaN semiconductor layer 30 can be grown after a second buffer layer 31 is grown at a low temperature.

A semiconductor can be slowly grown or can not be grown where the pattern 11, 12, or 13 is formed, and can be grown where no pattern 11, 12, or 13 is formed. Those grown semiconductors are met each other through the lateral growth in order to form the plane GaN semiconductor layer 30. In the side grown portion of the GaN semiconductor layer 30, threading dislocation disappears such that a crystalline structure characteristic can be improved.

The GaN semiconductor layer 30 can be separated from the substrate 10 and can be used as a GaN substrate. The separation of the substrate 10 can be accomplished by etching the first buffer layer 20. As mentioned above, the pattern 11, 12, or 13 on the substrate 10 can allow these etching processes to be smoothly accomplished.

At this point, the etching solution can use a phosphoric acid or sulphuric acid mixed solution of a high temperature of 200° C. to 300° C., aqua regia, or Buffered Oxide Etcher (BOE).

Third Embodiment

FIGS. 10 to 14 are views illustrating a method for manufacturing a light emitting device according to a third embodiment. The third embodiment can adopt technical features of the first and second embodiments, and distinguished contents from the first and second embodiments will be discussed.

As shown in FIG. 10, a light emitting device can be manufactured by growing a GaN semiconductor layer 30 on a substrate 10 having a buffer layer 20. The GaN semiconductor layer 30 can include an n-type semiconductor layer 32, an active layer 33, and a p-type semiconductor layer 34. The GaN semiconductor layer 30 can be grown on the second buffer layer 31 grown at a low temperature.

Next, as illustrated in FIG. 11, a later chip separation process can be easily accomplished by etching each unit device separation region. The unit device separation region can correspond to the pattern 11 of the second embodiment. When the unit device separation region corresponds to the pattern 11, substrate separation and chip separation processes for a vertical structure can be more smoothly accomplished. Moreover, although the pattern 11 having a stripe groove is illustrated in FIG. 11, it is not limited thereto. Also, the pattern can include the pattern 12 having a rectangular groove or a circular pattern 13.

Next, a p-type electrode 40 can be formed on the p-type semiconductor layer 34 of the semiconductor layer 30. This p-type electrode 40 can be an ohmic electrode, and an additional reflective electrode or a reflective ohmic electrode can be formed also.

Next, as illustrated in FIG. 12, a supporting substrate 50 can be formed on or attached to the p-type electrode 40. This supporting substrate 50 can support a light emitting device structure during a separation process of the substrate 10.

The supporting substrate 50 can be formed on the p-type electrode 40 through plating or bonding. In some cases, an additional coupling metal layer (not shown) can be disposed between the p-type electrode 40 and the supporting substrate 50. This supporting substrate 50 can include a metal or semiconductor wafer.

Next, the substrate 10 can be removed during the supporting substrate 50 supports the chip. This removing of the substrate 10 can be accomplished by etching the first buffer layer 20, and the separation process of the substrate 10 can be performed through the same process as the second embodiment.

Next, as illustrated in FIG. 13, the second buffer layer 31 exposed after the substrate 10 can be separated is additionally etched and removed, and then an n-type electrode 60 can be formed on the n-type semiconductor layer 32.

Next, as illustrated in FIG. 14, a unit light emitting device having the supporting substrate 50 can be manufacture by dividing the supporting substrate 50 supporting several unit devices into each device isolation region. If necessary, a unit light emitting device without the supporting substrate 50 can be manufactured by removing the supporting substrate 50.

Forth Embodiment

FIGS. 15 to 17 are views illustrating a method for manufacturing a light emitting device according to a fourth embodiment. The fourth embodiment can adopt technical features of the first to third embodiments, and distinguished contents from the first to third embodiments will be discussed.

As shown in FIG. 15, unlike the third embodiment, in the fourth embodiment, a first buffer layer 20 can be formed before the pattern 11 is formed on a substrate 10.

Next, as shown in FIG. 16, the pattern 11 can be formed in the substrate 10 having the first buffer layer 20. Although the pattern 11 having a stripe groove is illustrated in FIG. 16, it is not limited thereto. Also, the pattern 11 can include a pattern 12 having a rectangular groove or a circular pattern 13.

Next, as shown in FIG. 17, a second buffer layer 31 can be formed at a low temperature, and then a GaN semiconductor layer 30 can be formed at a high temperature. The semiconductor layer 30 grown on the pattern 11 can improve its quality through the lateral growth.

Next, the substrate 10 can be separated using the first buffer layer 20 as a basis in order to use the semiconductor layer 30 as the GaN substrate or form a light emitting structure.

Fifth Embodiment

FIGS. 18 to 20 are views illustrating a method for manufacturing a light emitting device according to a fifth embodiment. The fifth embodiment can adopt technical features of the first to fourth embodiments, and distinguished contents from the first to fourth embodiments will be discussed.

As shown in FIG. 18, a GaN semiconductor layer 300 can be grown on a substrate 100 having a second pattern 110. The second pattern 110 can be formed including several units of second pattern 110 in the one unit of light emitting device structure. That is, a unit structure of the second pattern 110 can be more densely formed comparing to the light emitting device area.

Likewise, a third buffer layer 200 can be formed on the substrate 100 having the dense second pattern 110, and a GaN semiconductor layer 300 including an n-type semiconductor layer 310, an active layer 320, and a p-type semiconductor layer 330 can be formed on the metallic third buffer layer 200. The second pattern 110 is dense and the third buffer layer 200 can not be formed in the second pattern 110. However, this is not limited thereto.

Next, as shown in FIG. 18, the etching of the unit device separation region can allow a later chip separation process to be easily accomplished. Next, a p-type electrode 400 can be formed on the p-type semiconductor layer 330.

Next, as shown in FIG. 19, a passivation layer 500 can be formed on an exposed surface including the side of the semiconductor layer 300, which is exposed by etching the unit device separation region. This passivation layer 500 can prevent leakage current when the light emitting device is driven, such that electrical characteristics can be improved and the semiconductor layer 300 can be protected, simultaneously.

Additionally, the passivation layer 500 can protect the semiconductor layer 300 from being etched during the removing of the substrate 100.

Next, as shown in FIG. 20, a supporting substrate 600 can be formed on the p-type electrode 400, and the third buffer layer 200 can be etched. Therefore, after the substrate 100 is removed, an n-type electrode 700 can be formed on the exposed n-type semiconductor layer 310 to complete a light emitting device.

INDUSTRIAL APPLICABILITY

In a method for manufacturing a light emitting device according to embodiments, a vertical light emitting device is formed through a high quality nitride semiconductor. Therefore, light emission efficiency, reliability, and productivity can be improved.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A method for manufacturing a light emitting device, the method comprising:
    preparing a substrate where a crystal growth surface has an a-plane or an m-plane, wherein the substrate comprises at least one pattern;
    forming a buffer layer on the substrate;
    forming a semiconductor layer on the buffer layer;
    separating the semiconductor layer by a unit device separation region, wherein the unit device separation region partially corresponds to at least the pattern on the substrate; and
    separating the semiconductor layer from the substrate by removing the buffer layer.

2. The method according to claim 1, wherein the substrate comprises a non-polar substrate.

3. The method according to claim 1, before the separating of the semiconductor layer, comprising:
    forming a first electrode layer on the semiconductor layer and forming a supporting substrate on the first electrode layer; and
    forming a second electrode layer on the semiconductor layer exposed by the removing of the buffer layer.

4. The method according to claim 1, wherein the buffer layer comprises one of a metal, a metal nitride, a metal carbide, and a metal oxide.

5. The method according to claim 1, wherein the buffer layer comprises a groove.

6. A method for manufacturing a light emitting device, the method comprising:
    preparing a substrate;
    forming a pattern on the substrate;
    forming a semiconductor layer on the substrate having the pattern;
    separating the semiconductor layer by a unit device separation region, wherein the unit device separation region partially corresponds to at least the pattern on the substrate; and
    separating the semiconductor layer from the substrate by using the pattern as a basis.

7. The method according to claim 6, wherein a plane of the pattern comprises one of a parallel stripe pattern, a pattern having a plurality of rectangular grooves, and a circular pattern.

8. The method according to claim 6, comprising forming a first buffer layer on the substrate having the pattern.

9. The method according to claim 8, comprising forming a second buffer layer on the first buffer layer.

10. The method according to claim 6, comprising:
    forming a first electrode on the semiconductor layer divided into the unit; device separation region;
    forming a supporting substrate on the first electrode;
    removing the substrate; and
    forming a second electrode on the semiconductor layer exposed by the removing of the substrate.

11. The method according to claim 6, after separating the semiconductor layer by the unit device separation region, comprising forming a passivation layer on at least a portion of the semiconductor layer.

12. A method for manufacturing a light emitting device, the method comprising:
    preparing a substrate;
    forming a first buffer layer on the substrate;
    forming a pattern on the substrate having the first buffer layer;
    forming a semiconductor layer on the substrate having the pattern;
    separating the semiconductor layer by a unit device separation region, wherein the unit device separation region corresponds to at least the pattern on the substrate; and
    separating the semiconductor layer from the substrate by using the pattern as a basis.

13. The method according to claim 12, comprising:
    forming a second buffer layer on the first buffer layer; and
    forming the semiconductor layer on the second buffer layer.

* * * * *